United States Patent
He

(10) Patent No.: US 10,103,294 B2
(45) Date of Patent: Oct. 16, 2018

(54) EQUIPMENT SYSTEM USING DEFORMABLE ORGANIC SILICONE RESIN PHOTOCONVERTER TO BOND-PACKAGE LED

(71) Applicant: Jiangsu Cherrity Optronics Co., Ltd., Jiangning Nanjing (CN)

(72) Inventor: Jinhua He, Jiangning Nanjing (CN)

(73) Assignee: JIANGSU CHERRITY OPTRONICS CO., LTD, Jiangsu (CN)

( * ) Notice: Subject to any disclaimer, the term of this patent is extended or adjusted under 35 U.S.C. 154(b) by 0 days.

(21) Appl. No.: 15/749,859

(22) PCT Filed: Dec. 16, 2015

(86) PCT No.: PCT/CN2015/097634
§ 371 (c)(1),
(2) Date: Feb. 2, 2018

(87) PCT Pub. No.: WO2017/028420
PCT Pub. Date: Feb. 23, 2017

(65) Prior Publication Data
US 2018/0233636 A1   Aug. 16, 2018

(30) Foreign Application Priority Data
Aug. 18, 2015   (CN) .......................... 2015 1 0509528

(51) Int. Cl.
*B29C 37/00*   (2006.01)
*H01L 33/50*   (2010.01)
(Continued)

(52) U.S. Cl.
CPC ............ *H01L 33/505* (2013.01); *H01L 24/96* (2013.01); *H01L 21/561* (2013.01);
(Continued)

(58) Field of Classification Search
CPC ..... H01L 33/505; H01L 24/96; B29C 66/834; B29C 66/83411; Y10T 156/1741
(Continued)

(56) References Cited

U.S. PATENT DOCUMENTS

| 5,929,961 A * | 7/1999 | Nishi .................... G02F 1/1333 349/150 |
| 7,591,863 B2 | 9/2009 | Watanabe et al. |

(Continued)

FOREIGN PATENT DOCUMENTS

| CN | 103855327 A | 6/2014 |
| WO | 2015022948 A1 | 2/2015 |
| WO | 2017028420 A1 | 2/2017 |

OTHER PUBLICATIONS

State Intellectual Property Office of the P.R. China, International Search Report for PCT/CN2015/097634, dated Jun. 1, 2016, 4 pp.

*Primary Examiner* — James D Sells
(74) *Attorney, Agent, or Firm* — Edwin S. Flores; Chalker Flores, LLP

(57) ABSTRACT

An equipment system for bond-packaging an LED using a special-shaped organic silicone resin photoconverter includes: a roll-laminating apparatus used for refining a photoconversion sheet (8-6); a roll-shaping apparatus used for performing heating and roll-shaping on the refined photoconversion sheet (8-6); a sheet-melting apparatus (3) used for performing sheet melting on the roll-shaped refined photoconversion sheet (8-6); and a roll-bonding apparatus used for performing roll-bonding on the sheet-melted refined photoconversion sheet and a flip chip LED array with a carrier film, the refined photoconversion sheet and the flip chip LED array facing each other and being aligned with each other. The roll-laminating apparatus, the roll-shaping apparatus, the sheet-melting apparatus, and the roll-bonding apparatus are arranged sequentially to form cooperatively (Continued)

linked process equipment. The present invention has a significant advantage of bond-packaging an LED by continuous rolling, and can meet a requirement of bond-packaging an LED using an organic silicone resin photoconverter, thereby enhancing the production efficiency and yield of LED packages in industrialized batch production.

17 Claims, 13 Drawing Sheets

(51) Int. Cl.
  *H01L 23/00* (2006.01)
  *H01L 21/56* (2006.01)
(52) U.S. Cl.
  CPC ........... *H01L 2224/95115* (2013.01); *H01L 2933/0033* (2013.01); *H01L 2933/0041* (2013.01)
(58) Field of Classification Search
  USPC .................................. 156/555, 582
  See application file for complete search history.

(56) References Cited

U.S. PATENT DOCUMENTS

| | | | |
|---|---|---|---|
| 2008/0044940 A1* | 2/2008 | Watanabe | B32B 37/20 438/64 |
| 2015/0171288 A1 | 6/2015 | Matsumara et al. | |
| 2016/0185074 A1 | 6/2016 | Kagawa | |

* cited by examiner

EQUIPMENT SYSTEM USING DEFORMABLE ORGANIC SILICONE RESIN PHOTOCONVERTER TO BOND-PACKAGE LED

CROSS-REFERENCE TO RELATED APPLICATIONS

This application is the National Stage of International Application No. PCT/CN2015/097634, filed on 16 Dec. 2015 claiming the priority of CN 201510509528.6 filed on 18 Aug. 2015, the content of each of which is incorporated by reference herein.

BACKGROUND OF THE INVENTION

Technical Field

The present invention relates to the technical field of LED packaging equipment, and in particular, to an equipment system for bond-packaging an LED using a special-shaped organic silicone resin photoconverter.

Background

With the advantages such as high brightness, low heat, long service life, and being environmentally friendly and renewable, LEDs are known as the most promising new generation of green light sources in the 21st century. At present, the theoretical service life of the LED can be over 100,000 hours. However, during actual application, limited by many factors such as chip failure, package failure, thermal overstress failure, electrical overstress failure, and/or assembly failure, especially limited by the package failure, the LED prematurely encounters luminous decay or loss of luminous efficacy, thus hindering development of the LED to be a novel energy-saving light source. To solve these problems, many scholars in the field have carried out related researches, and have proposed some improvement measures to enhance luminous efficacy and actual service life of the LED. For example, flip-chip LED packaging is developed in recent years. Compared with conventional LED upright packaging, this flip-chip manner has such advantages as high luminous efficacy, high reliability, and easy integration. This manner also greatly saves packaging materials. For example, materials such as a gold wire, die bonding glue, and a support that are used in the conventional LED upright packaging are no longer needed. Further, this manner greatly simplifies a packaging process. For example, die bonding, wire soldering, and even light splitting in the conventional LED upright packaging are no longer needed. In this way, the LED flip-chip packaging is increasingly widely applied. However, it should also be noted that, the existing flip-chip LED packaging technologies mostly bond a photoconverter made of an organic silicone resin to a flip chip LED by using a casting process, a screen printing process, an upper and lower flat plate molding process, a single roller pressing process, and the like. These processes and matched packaging equipment cannot desirably solve flaws such as pores and unequal thickness of the photoconverter made of the organic silicone resin, thus causing a low yield of the LEDs packaged by using a photoconverter. In addition, due to low production efficiency, the high product costs cannot be reduced.

Chinese patent application NO. 201010204860.9 discloses a "flip-chip LED packaging method", which includes steps of: (a) coating a surface of an LED chip with a photoconverter through screen printing, and baking the photoconverter to cure the photoconverter; (b) fixing the LED chip on a chip substrate, such that electrodes of the LED chip and electrodes of the chip substrate are bonded; (c) fixing the LED chip and the chip substrate to the bottom of a reflector cup on a support; (d) separately connecting positive and negative electrodes of the fixed chip substrate to positive and negative electrodes of the support by using wires; (e) placing a sealing mold or lens cover on the support on which the LED chip and the chip substrate are fixed, and filling the sealing mode or lens cover with silica gel; and (f) baking a whole structure to cure it. This method uses the screen printing process to enhance uniformity of coating thickness of the photoconverter and enhance distribution uniformity of fluorescent powder particles, so as to improve the yield. However, there exist the following obvious defects: First, after the surface of the LED chip is coated with the photoconverter made of the organic silicone resin through a screen printing process, due to thermal overstress in a subsequent baking and curing procedure, pores still occur in part of the photoconverter coating and the coated surface of the LED chip, thus forming sags and crests. Secondly, after the sealing mold or lens cover is filled with the silica gel and packaged together with the photoconverter-coated LED chip, due to thermal overstress in the subsequent procedure of baking and curing the whole structure, pores still occur in part of the silica gel layer on the sealing mold or lens cover, thus forming sags and crests. Because the thermal overstress impact on the LED chip cannot be resolved in the packaging procedure, LED luminous efficacy is reduced inevitably. Thirdly, no intelligent control system is equipped to control the whole LED chip packaging process, which directly affects improvement of the yield.

Chinese patent application NO. 201310270747.4 discloses an "LED coated with photoconverter layer, manufacturing method for same, and LED device". This solution includes: an LED configuration stage, in which an LED is configured on a surface of a support chip in a through-thickness direction; a layer configuration stage, in which a photoconverter layer is configured on a surface of the support chip in the through-thickness direction in the same manner as LED configuration, the photoconverter layer being formed by active energy ray cured resin which is cured by irirradiation with an active energy ray and a fluorescent resin composition of the photoconverter; a curing stage, in which the photoconverter layer is irradiated with an active energy ray to cure the photoconverter layer; a cutting stage, in which the photoconverter layer is cut corresponding to the LED, to obtain an LED coated with the photoconverter layer; and an LED separation stage, in which the LED coated with the photoconverter layer is separated from the support chip after the cutting process. This method aims to offer a solution to uniform configuration of photoconverters around the LED to avoid damage, thus obtaining an LED coated with a photoconverter layer, and an LED device having the LED coated with the photoconverter layer. However, there exist the following obvious defects: First, in a curing procedure of the fluorescent resin composition of the photoconverter, due to thermal overstress, pores still occur in part of the photoconverter surface layer, thus forming sags and crests. Secondly, the LED coated with the photoconverter layer is still affected by the thermal overstress, causing a decrease in luminous efficacy of the LED in use. Thirdly, the stages of the whole packaging process are complicated, causing low production efficiency of LED packages. Fourthly, an upper and lower flat plate molding process may cause displacement of a flip chip, thus inevitably reducing the yield.

Chinese patent application NO. 201380027218.X discloses a "resin sheet laminate, and manufacturing method for semiconductor light-emitting element using same". In this solution, the resin sheet laminate is formed by disposing a fluorophor-containing resin layer on a substrate, where the fluorophor-containing resin layer has multiple regions, the substrate has a lengthwise direction and a transverse direction, and the multiple regions are arranged along the lengthwise direction repeatedly to form columns. By using the resin sheet laminate, this solution aims to enhance uniformity of color and brightness of a semiconductor light-emitting element to which the fluorophor-containing resin layer is attached, and make it easy to manufacture and free to design the element. However, there exist the following obvious defects: First, the used fluorescent resin sheet is a cured fluorescent resin sheet, and therefore, possible residual pores, sags and crests, or other flaws produced during processing cannot be effectively eliminated. Secondly, in a bonding stage, a pressure is exerted by a pressurizing tool from a side of the semiconductor light-emitting element, which may damage the semiconductor light-emitting element. Thirdly, in the bonding stage using an adhesive in the fluorophor-containing resin layer, it is difficult to eliminate residuals from the semiconductor light-emitting element after bonding, and pores easily occur in the bonding procedure, thus reducing the yield; in addition, existence of the bonding layer reduces light emission efficiency of the LED element. Fourthly, the substrate under the fluorescent resin sheet bonded to the light emitting surface of the semiconductor light-emitting element is not removed, which directly affects luminous efficacy of the semiconductor light-emitting element. Fifthly, the multiple regions of the fluorophor-containing resin layer are arranged in the lengthwise direction repeatedly to form columns, but actually it is complex to arrange the multiple regions of the fluorophor-containing resin layer in such a manner, thus affecting the packaging efficiency of the whole element. An error in arrangement positions of the multiple regions directly affects the precision of subsequent bonding with the light-emitting element. If the multiple regions cannot be rendered uniform in size and thickness, a severe problem of product inconsistency may emerge.

To sum up, nowadays, how to overcome the defects in the prior art has become one of major difficulties to be solved urgently in the technical field of LED packaging using a photoconverter.

SUMMARY OF THE INVENTION

An objective of the present invention is to overcome the defects in the prior art and provide an equipment system for bond-packaging an LED using a special-shaped organic silicone resin photoconverter. The present invention has a significant advantage of bond-packaging an LED by continuous rolling, and can meet a condition requirement of bond-packing an LED using an organic silicone resin photoconverter, thereby enhancing the production efficiency and yield of LED packages in industrialized batch production.

The present invention is a branch technical solution of a process for bond-packaging an LED using a special-shaped organic silicone resin photoconverter provided by the applicant of the present invention.

The present invention provides an equipment system for bond-packaging an LED using a special-shaped organic silicone resin photoconverter, which includes: a roll-laminating apparatus used for refining a photoconversion sheet; a roll-shaping apparatus used for performing heating and roll-shaping on the refined photoconversion sheet; a sheet-melting apparatus used for performing sheet melting on the roll-shaped refined photoconversion sheet; and a roll-bonding apparatus used for performing roll-bonding on the sheet-melted refined photoconversion sheet and a flip chip LED array with a carrier film, the refined photoconversion sheet and the flip chip LED array facing each other and being aligned with each other. The roll-laminating apparatus, the roll-shaping apparatus, the sheet-melting apparatus, and the roll-bonding apparatus are arranged sequentially to form cooperatively linked process equipment. The roll-laminating apparatus includes one or more sets of smooth-surface rolling components A and smooth-surface rolling components B that perform rolling face-to-face in alignment with each other. The roll-shaping apparatus includes a first rolling device with a protrusion array and a second rolling device with a recess array that perform rolling face-to-face in alignment with each other. The roll-bonding apparatus includes a third rolling device with a smooth surface and a fourth rolling device with a recess array that perform rolling face-to-face in alignment with each other.

An implementation principle of the present invention is as follows: To better solve the problems in the existing LED packaging process, the present invention subtly designs an equipment system for bond-packaging an LED using a special-shaped organic silicone resin photoconverter. A principle of bond-packaging by rolling of the present invention is as follows: First, a roller is used to roll a semi-cured photoconversion sheet to produce a flow in sags and crests in the sheet, so as to eliminate possible residual pores, sags and crests, or other flaws produced during processing in the photoconversion sheet, thereby obtaining a flat refined photoconversion sheet without pores and having a uniform thickness. Secondly, the rolled semi-cured organic silicone resin photoconversion sheet is deformable during processing, to form a photoconverter light emitting surface layer with a required optimal shape, such as a cambered surface, a hemispheric surface, or a planar surface. Thirdly, by using a sheet melting technology by illumination, an outer protective film B of meltable organic silicon photosensitive resin containing a photoconversion material and the semi-cured photoconversion sheet can be subtly fused and integrated, thus achieving tight bonding to flip chip LEDs. Fourthly, the present invention provides a flow-type continuous process equipment system, which can meet processing conditions of batch production of LED package elements and achieve consistent specifications and dimensions. In this way, the production efficiency of the LED package elements is enhanced, brightness and color uniformity of finished LED package elements is improved, and the yield is greatly improved.

The present invention has the following remarkable advantages in comparison with the prior art:

First, the equipment system provided by the present invention is applicable to a novel process of bond-packaging an LED using an organic silicone resin photoconverter by continuous rolling, which solves the problems of low light emission efficiency, low production efficiency, and a low yield of the LED bond-packaged by using existing conventional processes such as a casting process, a screen printing process, an upper and lower flat plate molding process, a single roller pressing process, and the like. The present invention can meet a condition requirement of bond-packaging the LED by using a semi-cured organic silicone resin photoconverter, and enhance the production efficiency and yield of industrialized LED packaging in batches.

Secondly, the present invention provides a new process of forming a special-shaped photoconversion sheet, and therefore a light-emitting surface layer of various special shapes such as a cambered surface, a hemispheric surface, and a planar surface can be manufactured. In this way, possible residual pores, sags and crests, or other flaws produced during processing in the photoconversion sheet can be effectively eliminated, thus significantly improving brightness and color uniformity of finished LED package elements. Moreover, the special-shaped light-emitting surface layer can effectively enhance the light emission efficiency and uniformity of the finished LED package elements.

Thirdly, the new process of sheet melting provided by the present invention can overcome the defects in the existing sheet removing process for a protective film layer, and implement a continuous process flow of roll-bonding an organic silicone resin photoconverter sheet to an LED. Moreover, it is suitable to equip an equipment system for implementing a continuous process and to carry out intelligent control, so as to better meet a production requirement of industrialized LED packaging in batches. In this way, the production efficiency of industrialized LED packaging in batches is remarkably improved.

Fourthly, the process provided by the present invention is widely applicable to a packaging process of bonding an organic silicone resin photoconverter to flip chip LEDs of different power, thus completely meeting a requirement of refining the product production process during industrialized LED packaging in batches.

BRIEF DESCRIPTION OF THE DRAWINGS

FIG. 8A-1 is a left view, FIG. 8A-2 is a right view, FIG. 8A-3 is a bottom view, and FIG. 8A-4 is a three-dimensional view;

FIG. 8B-1 is a left view, FIG. 8B-2 is a right view, FIG. 8B-3 is a bottom view, and FIG. 8B-4 is a three-dimensional view; FIG. 8C-1 is a left view, FIG. 8C-2 is a right view, FIG. 8C-3 is a bottom view, and FIG. 8C-4 is a three-dimensional view.

Meaning of numerals in the accompanying drawings of the present invention:

1-1 Smooth-surface single-wheeled roller A1 of a roll-laminating apparatus
1-2 Smooth-surface single-wheeled roller B1 of a roll-laminating apparatus
1-3 Smooth-surface single-wheeled roller A2 of a roll-laminating apparatus
1-4 Smooth-surface single-wheeled roller B2 of a roll-laminating apparatus
1-5 First buffer roller
1-6 Second buffer roller
2-1 First single-wheeled roller with a protrusion array in a roll-shaping apparatus
2-2 Second single-wheeled roller with a recess array in a roll-shaping apparatus
2-3 Second planar conveyor with a recess array in a roll-shaping apparatus
2-4 Protrusion on a first single-wheeled roller with a protrusion array in a roll-shaping apparatus
2-5 Recess on a second single-wheeled roller with a recess array in a roll-shaping apparatus
2-6 Recess on a second planar conveyor with a recess array in a roll-shaping apparatus
3 Sheet-melting apparatus
4-1 Third single-wheeled roller with a smooth surface in a roll-bonding apparatus
4-2 Fourth single-wheeled roller with a recess array in a roll-bonding apparatus
4-3 Recess on a fourth single-wheeled roller with a recess array in a roll-bonding apparatus
4-4 flip chip LED in a flip chip LED array sheet
4-5 Carrier film in a flip chip LED array sheet
5 Curing apparatus
6 Removing and cutting apparatus
7 Wind-up roller
8-1 Semi-cured photoconversion membrane 8-2 Semi-cured photoconversion slurry
8-3 Outer protective film A
8-4 Outer protective film B
8-5 Semi-cured photoconversion sheet
8-6 Refined photoconversion sheet manufactured by using a roll-laminating apparatus
8-7 Individual photoconversion sheet with recesses manufactured by using a roll-shaping apparatus
8-8 Individual photoconversion sheet with recesses obtained after sheet melting performed by a sheet melting apparatus
8-9 LED package elements manufactured by using a roll-bonding apparatus
9-1 Buffer roller
9-2 flip chip LED buffer roller

DETAILED DESCRIPTION OF THE INVENTION

Specific implementations of the present invention are described in detail below with reference to the accompanying drawings and embodiments.

Embodiment 1

Figure 1:
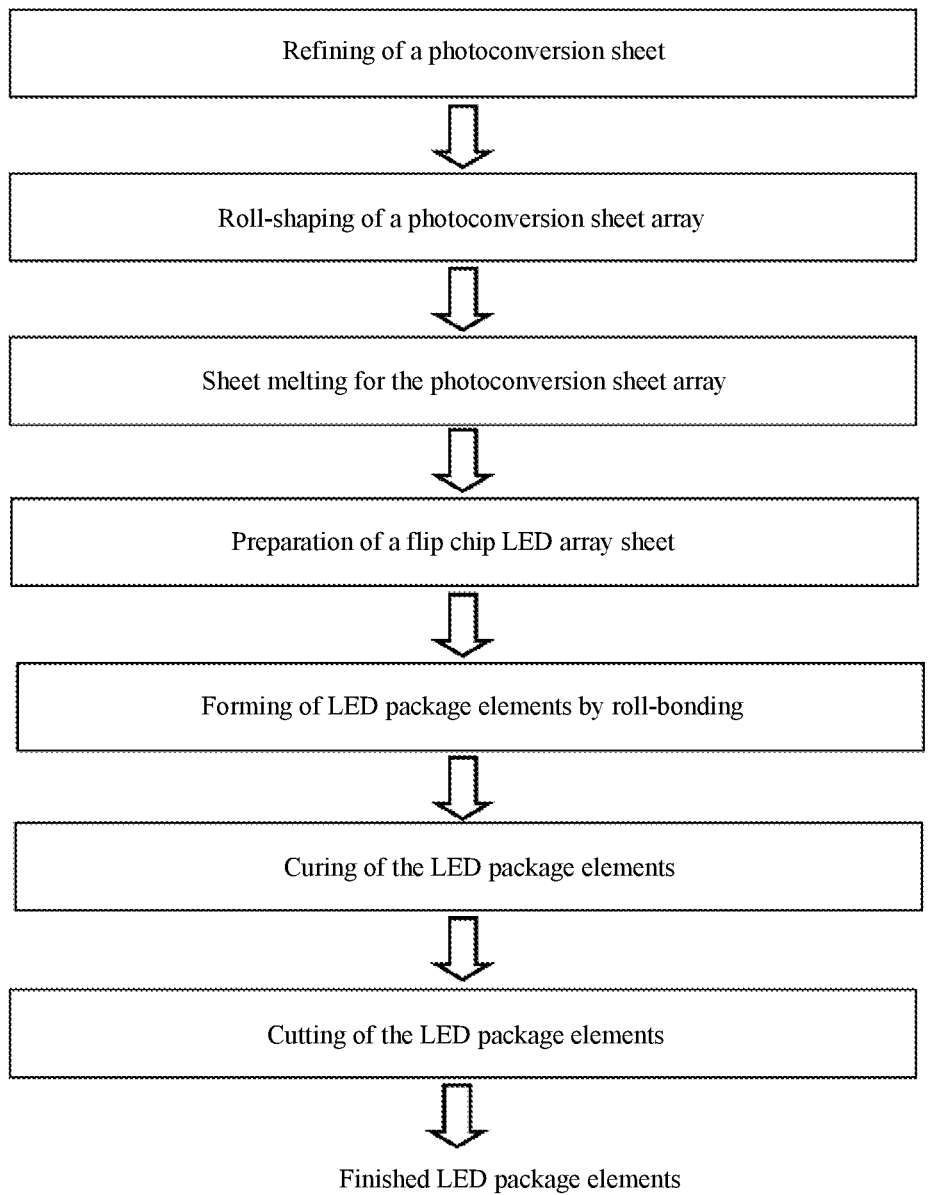
FIG. 1 is a schematic block diagram of procedures of a process for bond-packaging an LED using a special-shaped organic silicone resin photoconverter, to which an equipment system of the present invention is applied.
Figure 2:
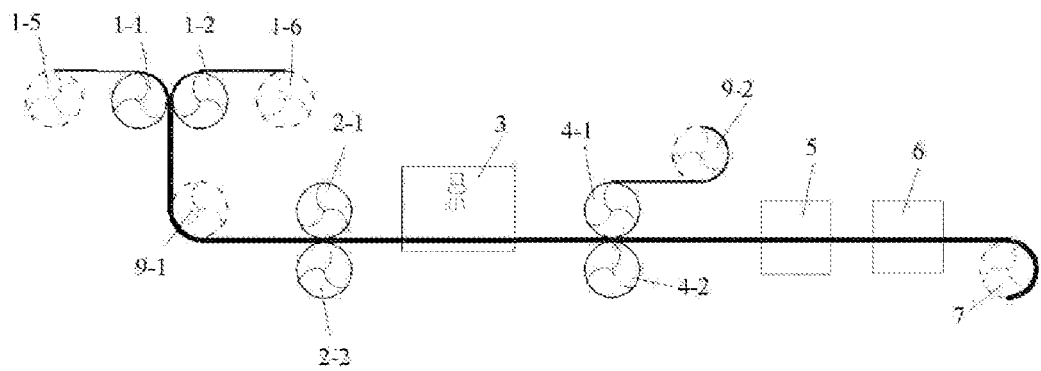
FIG. 2 is a schematic structural diagram of a flow layout of an equipment system for bond-packaging an LED using a special-shaped organic silicone resin photoconverter according to the present invention.

As shown in FIG. 1 and FIG. 2, the present invention provides an equipment system for bond-packaging an LED using a special-shaped organic silicone resin photoconverter, which includes: a roll-laminating apparatus used for refining a photoconversion sheet; a roll-shaping apparatus used for performing heating and roll-shaping on the refined photoconversion sheet; a sheet-melting apparatus used for performing sheet melting on the roll-shaped refined photoconversion sheet; and a roll-bonding apparatus used for performing roll-bonding on the sheet-melted refined photoconversion sheet and a flip chip LED array with a carrier film, the refined photoconversion sheet and the flip chip LED array facing each other and being aligned with each other. The roll-laminating apparatus, the roll-shaping apparatus, the sheet-melting apparatus, and the roll-bonding apparatus are arranged sequentially to form cooperatively linked process equipment. The roll-laminating apparatus includes one or more sets of smooth-surface rolling components A and smooth-surface rolling components B that perform rolling face-to-face in alignment with each other. The roll-shaping apparatus includes a first rolling device with a protrusion array and a second rolling device with a recess array that perform rolling face-to-face in alignment with each other. The roll-bonding apparatus includes a third rolling device with a smooth surface and a fourth rolling device with a recess array that perform rolling face-to-face in alignment with each other.

It should be noted that:

Apparatuses, devices or components for implementing processes related to the equipment system for bond-packaging an LED using a special-shaped organic silicone resin photoconverter provided by the present invention may all be preferentially selected from the existing field of precision machinery manufacturing according to requirements of specific implementations of the present invention.

Figure 3A:
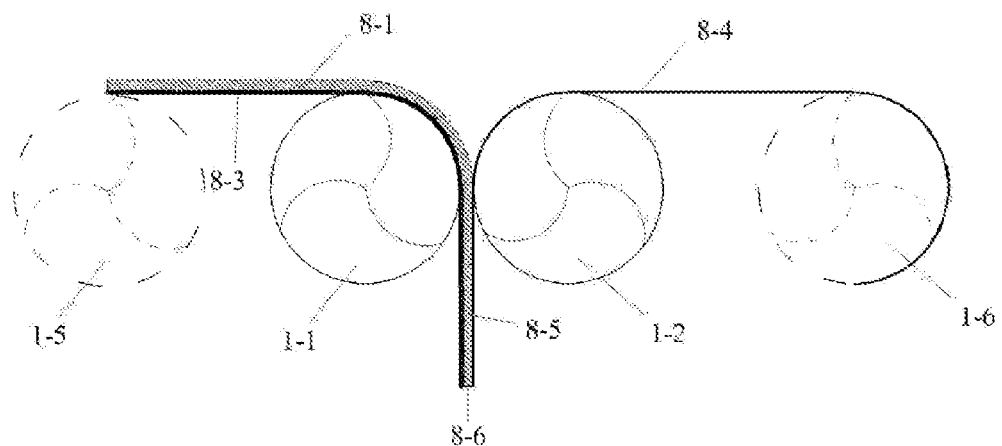
FIG. 3A is a schematic structural diagram of an embodiment of a roll-laminating apparatus in the equipment system for bond-packaging an LED using a special-shaped organic silicone resin photoconverter according to the present invention.
Figure 3B:
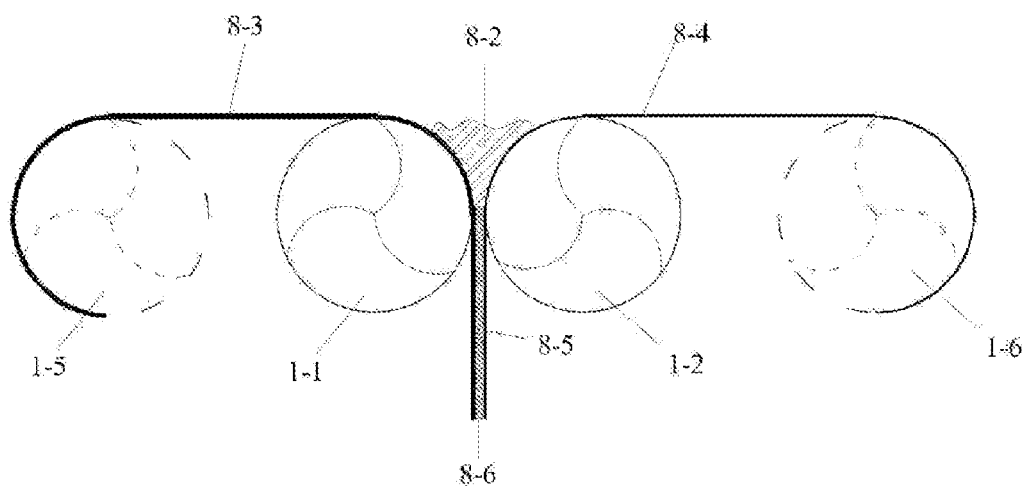
FIG. 3B is a schematic structural diagram of another embodiment of a roll-laminating apparatus in the equipment system for bond-packaging an LED using a special-shaped organic silicone resin photoconverter according to the present invention.
Figure 3C:
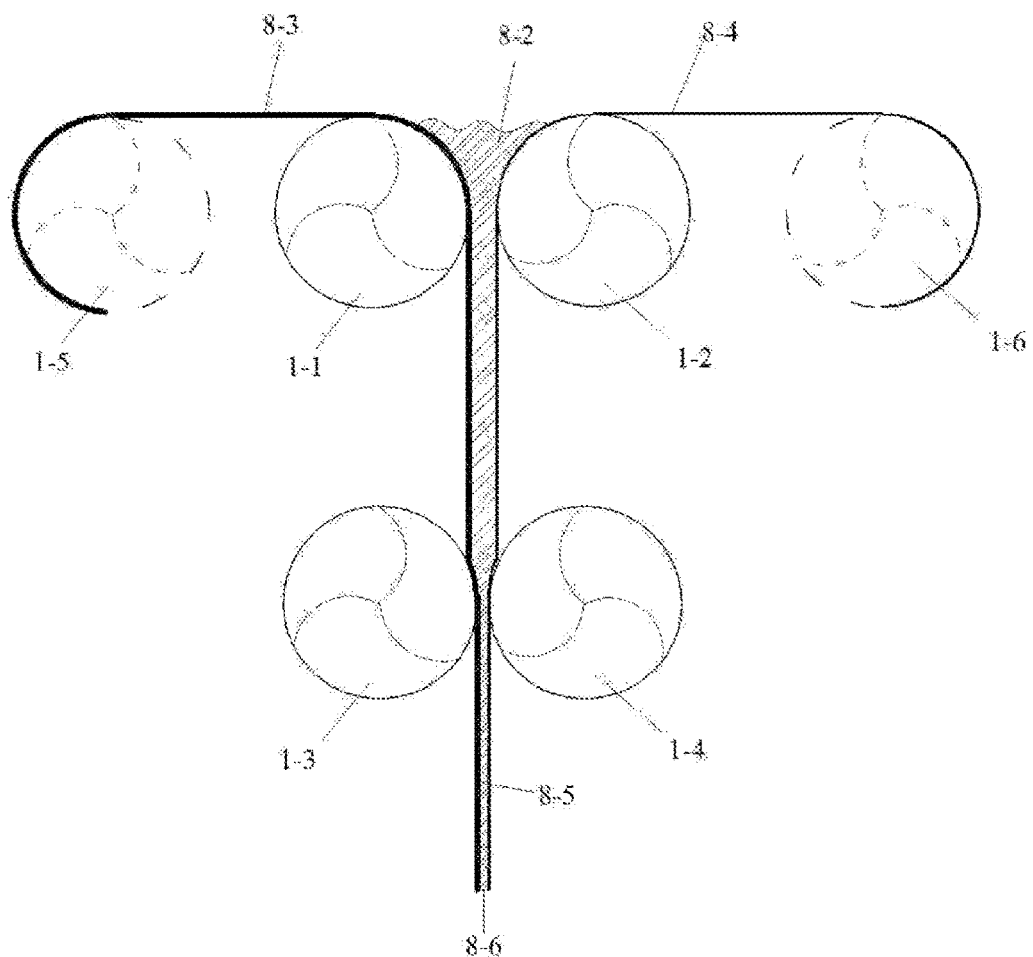
FIG. 3C is a schematic structural diagram of another embodiment of a roll-laminating apparatus in the equipment system for bond-packaging an LED using a special-shaped organic silicone resin photoconverter according to the present invention.

Further preferred solutions of the equipment system for bond-packaging an LED using a special-shaped organic silicone resin photoconverter provided by the present invention are as follows:

In the roll-laminating apparatus, the smooth-surface rolling component A is a smooth-surface single-wheeled roller A or a smooth-surface planar conveyor A, the smooth-surface rolling component B is a smooth-surface single-wheeled roller B or a smooth-surface planar conveyor B, and at least one of the smooth-surface rolling component A and the smooth-surface rolling component B is a single-wheeled roller. Referring to FIGS. 3A, 3B and 3C, FIG. 3A shows that the roll-laminating apparatus includes a smooth-surface single-wheeled roller A1 (1-1) and a smooth-surface single-wheeled roller B1 (1-2) that perform rolling face-to-face in alignment with each other; FIG. 3B shows that the roll-laminating apparatus includes a smooth-surface single-wheeled roller A1 (1-1) and a smooth-surface single-wheeled roller B1 (1-2) that perform rolling face-to-face in alignment with each other; and FIG. 3C shows that the roll-laminating apparatus includes two sets of smooth-surface rolling components A and two sets of smooth-surface rolling components B, specifically including a smooth-surface single-wheeled roller A1 (1-1) and a smooth-surface single-wheeled roller B1 (1-2) that perform rolling face-to-face in alignment with each other, and a smooth-surface single-wheeled roller A2 (1-3) and a smooth-surface single-wheeled roller B2 (1-4) that perform rolling face-to-face in alignment with each other. The one or more sets of smooth-surface roll-laminating apparatuses are used to roll an outer protective film A (8-3), a semi-cured photoconversion membrane (8-1) or semi-cured photoconversion slurry (8-2), and an outer protective film B (8-4), to obtain a refined photoconversion sheet (8-6).

Figure 4A:
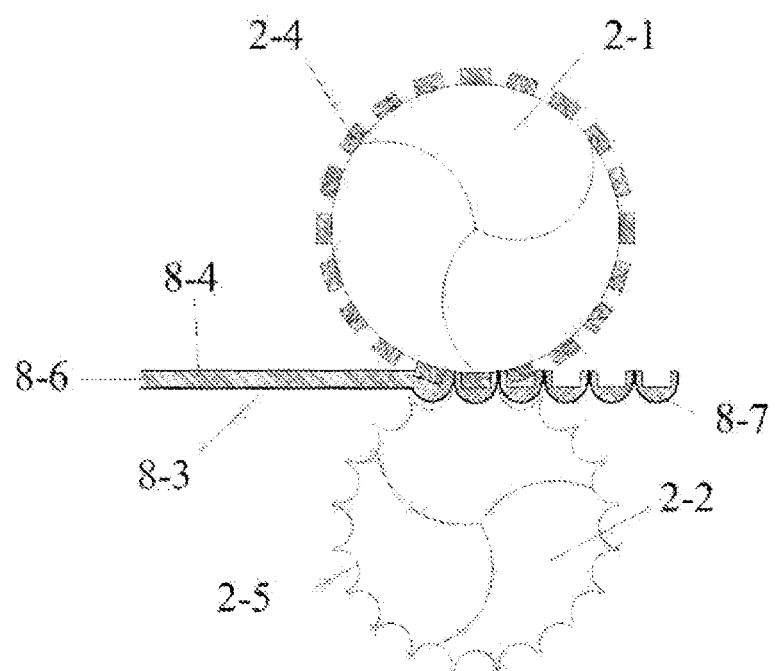
FIG. 4A is a schematic structural diagram of an embodiment of a roll-shaping apparatus in the equipment system for bond-packaging an LED using a special-shaped organic silicone resin photoconverter according to the present invention.
Figure 4B:
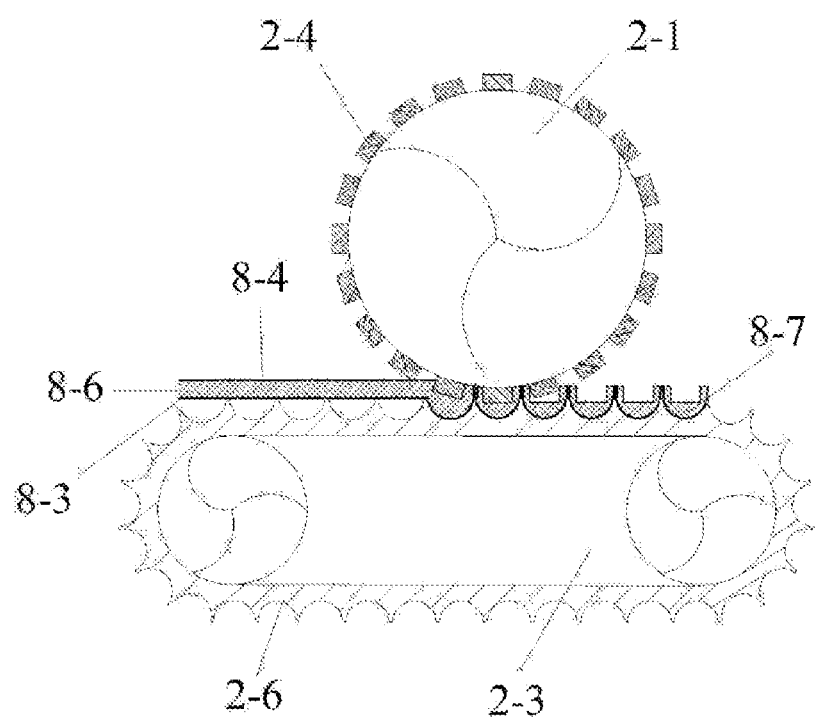
FIG. 4B is a schematic structural diagram of another embodiment of a roll-shaping apparatus in the equipment system for bond-packaging an LED using a special-shaped organic silicone resin photoconverter according to the present invention.

In the roll-shaping apparatus, the first rolling device with a protrusion array is a first single-wheeled roller with a protrusion array or a first planar conveyor with a protrusion array; the second rolling device with a recess array is a second single-wheeled roller with a recess array or a second planar conveyor with a recess array; and at least one of the first rolling device and the second rolling device is a single-wheeled roller. Referring to FIG. 4A and FIG. 4B, FIG. 4A shows that the roll-shaping apparatus includes a first single-wheeled roller (2-1) with a protrusion array and a second single-wheeled roller (2-2) with a recess array that are disposed face to face and aligned with each other; and FIG. 4B shows that the roll-shaping apparatus includes a first single-wheeled roller (2-1) with a protrusion array and a second planar conveyor (2-3) with a recess array that are disposed face to face and aligned with each other. The roll-shaping apparatus is used to perform heating and roll-shaping on the refined photoconversion sheet (8-6) with the outer protective film A (8-3) and the outer protective film B (8-4), to obtain a photoconversion sheet array formed by individual photoconversion sheets (8-7) with recesses.

Figure 5:
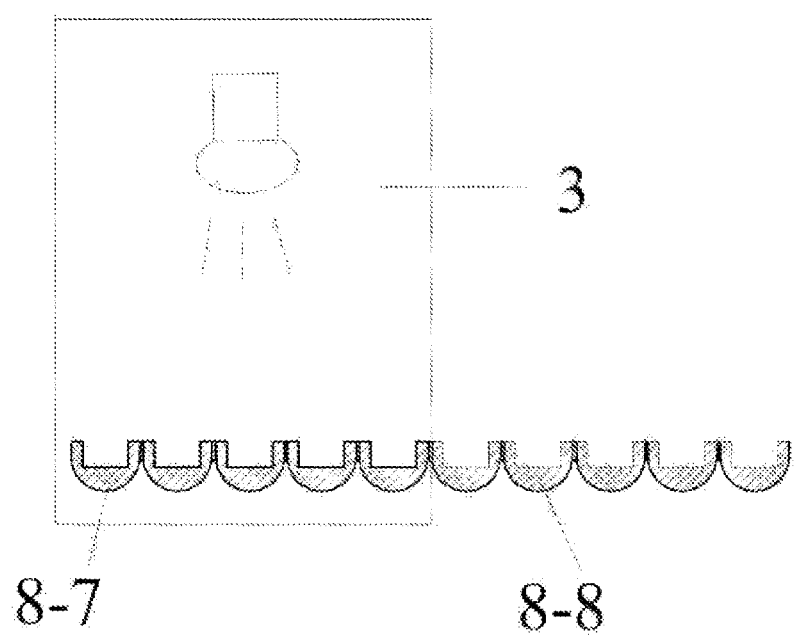
FIG. 5 is a schematic process diagram of a sheet-melting apparatus in the equipment system for bond-packaging an LED using a special-shaped organic silicone resin photoconverter according to the present invention.

The sheet-melting apparatus is a light irradiation apparatus including at least an irradiation light source and a planar conveyor. Referring to FIG. 5, FIG. 5 shows that, before sheet melting, the photoconversion sheet array formed by individual photoconversion sheets (8-7) with recesses passes through the sheet-melting apparatus 3, and the outer protective film B (8-4) of the photoconversion sheet array is radiated by light and then is integrated with the semi-cured photoconversion sheet, to obtain a sheet-melted photoconversion sheet array formed by individual photoconversion sheets (8-8) with recesses.

Figure 6:
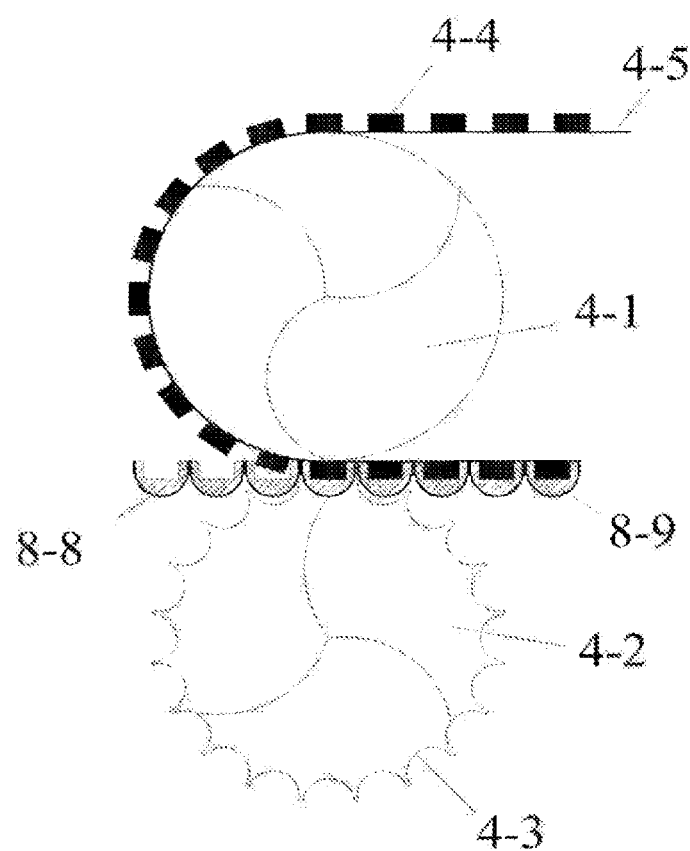
FIG. 6 is a schematic structural diagram of an embodiment of a roll-bonding apparatus in the equipment system for bond-packaging an LED using a special-shaped organic silicone resin photoconverter according to the present invention.

In the roll-bonding apparatus, the third rolling device with a smooth surface is a third single-wheeled roller with a smooth roll surface or a third planar conveyor with a smooth flat surface, the fourth rolling device with a recess array is a fourth single-wheeled roller with a recess array or a fourth planar conveyor with a recess array, and at least one of the device arranged with the photoconversion sheet array and the device arranged with a flip chip LED array sheet is a single-wheeled roller. As shown in FIG. 6, the roll-bonding apparatus includes a third single-wheeled roller (4-1) with a smooth surface and a fourth single-wheeled roller (4-2) with a recess array that perform rolling face-to-face in alignment with each other. The third single-wheeled roller (4-1) with a smooth surface and the fourth single-wheeled roller (4-2) with a recess array are used to perform roll-bonding on the sheet-melted photoconversion sheet array formed by individual photoconversion sheets (8-8) and the flip chip LED array sheet, the photoconversion sheet array and the flip chip LED array sheet facing each other and being aligned with each other, to obtain LED package elements (8-9).

The roll-laminating apparatus is provided with a displacement adjusting device for adjusting a distance between the smooth-surface rolling component A and the smooth-surface rolling component B. The roll-shaping apparatus is provided with a displacement adjusting device for adjusting a distance between the first rolling device and the second rolling device. The roll-bonding apparatus is provided with a displacement adjusting device for adjusting a distance between the third rolling device and the fourth rolling device.

Any one of the smooth-surface rolling component A and the smooth-surface rolling component B in the roll-laminating apparatus that is a single-wheeled roller has a radial run-out distance less than or equal to 2 μm. Any one of the first rolling device with a protrusion array and the second rolling device with a recess array in the roll-shaping apparatus that is a single-wheeled roller has a radial run-out distance less than or equal to 2 μm. Any one of the third rolling device with a smooth surface and the fourth rolling device with a recess array in the roll-bonding apparatus that is a single-wheeled roller has a radial run-out distance less than or equal to 2 μm.

In the second rolling device with a recess array in the roll-shaping apparatus and the fourth rolling device with a recess array in the roll-bonding apparatus, the recess arrays have the same recess shape, and the recess shape is a cambered surface, a hemispheric surface, or a planar surface.

In the first rolling device with a protrusion array in the roll-shaping apparatus, the shape of a protrusion is a planar surface, and the length, width, and height of the protrusion are 1.01 to 1.05 times of those of a flip chip LED.

The equipment system further includes a curing apparatus for curing LED package elements, where the curing apparatus is process equipment located at a rear end of the roll-bonding apparatus.

The curing apparatus is a tunnel-type temperature control apparatus or a tunnel-type illuminating apparatus. The tunnel-type temperature control apparatus includes a heating component, a temperature control component and a conveyor belt passage. The tunnel-type illuminating apparatus includes an illuminating component, an illumination intensity control component and a conveyor belt passage.

The equipment system further includes a cutting apparatus for cutting cured LED package elements, where the cutting apparatus is process equipment disposed at a rear end of the curing apparatus.

The cutting apparatus is a roll-cutting apparatus, where the roll-cutting apparatus includes a rolling component C with an arrayed cutter and a rolling component D with a smooth surface that are disposed face-to-face and aligned with each other.

The rolling component C with an arrayed cutter in the roll-cutting apparatus is a single-wheeled roller C with an arrayed cutter or a planar conveyor C with an arrayed cutter. The rolling component D with a smooth surface is a single-wheeled roller D with a smooth surface or a planar conveyor D with a smooth surface. At least one of the rolling component C with an arrayed cutter and the rolling component D with a smooth surface is a single-wheeled roller. The arrayed cutter is a cutter having an array of rectangular grids. Dimensions of the rectangular grid are the same as those of a finished individual LED package element.

The roll-cutting apparatus is provided with a displacement adjusting device for adjusting a distance between the rolling component C with an arrayed cutter and the rolling component D with a smooth surface. Any one of the rolling component C with an arrayed cutter and the rolling component D with a smooth surface that is a single-wheeled roller has a radial run-out distance less than or equal to 2 μm.

The equipment system further includes a flip chip LED array forming apparatus for forming a flip chip LED array, where the flip chip LED array forming apparatus is process equipment disposed at a front end of the roll-bonding apparatus. The flip chip LED array forming apparatus includes a manipulator for grabbing and placing a flip chip LED, and a planar conveying component having an accurate displacement positioning function.

The roll-laminating apparatus, the roll-shaping apparatus, the sheet-melting apparatus, the chip array forming apparatus, the roll-bonding apparatus, the curing apparatus, and the cutting apparatus in the equipment system are cooperatively linked in sequence, to form flow-type continuous process equipment.

Figure 7A:
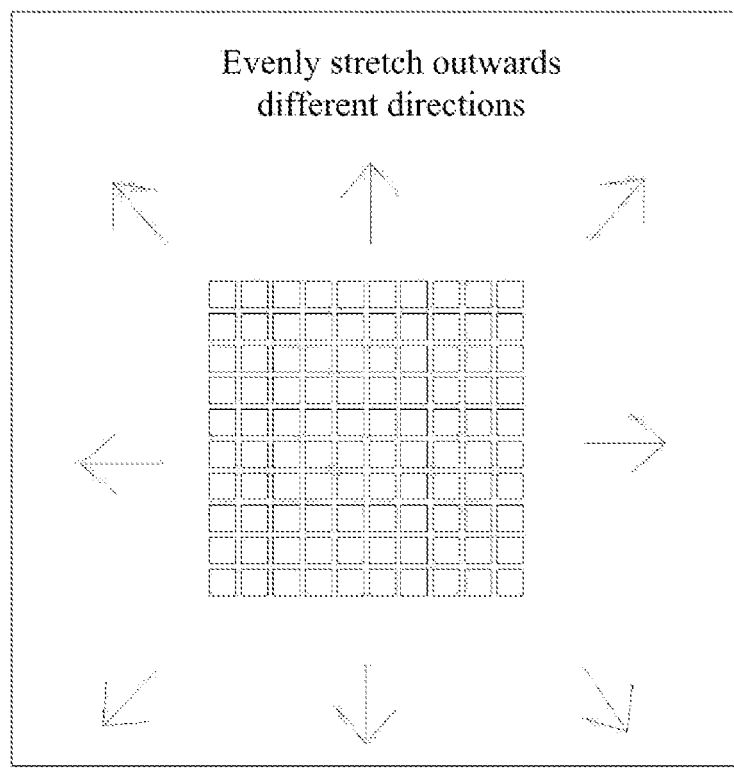
FIG. 7A is a schematic planar structural diagram of finished LED package elements manufactured according to the present invention.
Figure 7B:
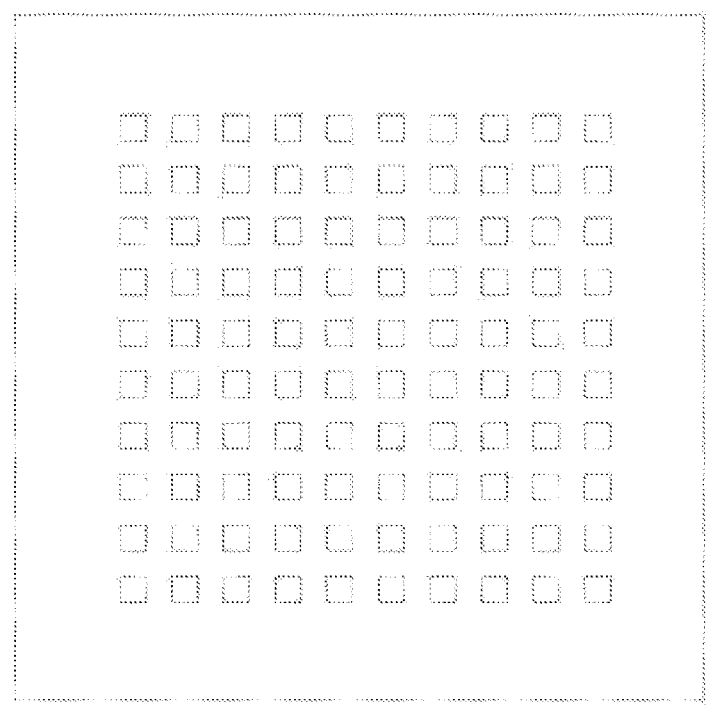
FIG. 7B is a schematic planar structural diagram of finished individual LED package elements obtained by stretching according to the present invention.

As required, a stretcher may be used to stretch the stretchable carrier film of the finished LED package elements manufactured according to the present invention, such that the finished LED package elements are split along the slits after being stretched, to obtain finished individual LED package elements, as shown in FIG. 7A and FIG. 7B.

Figure 8A:
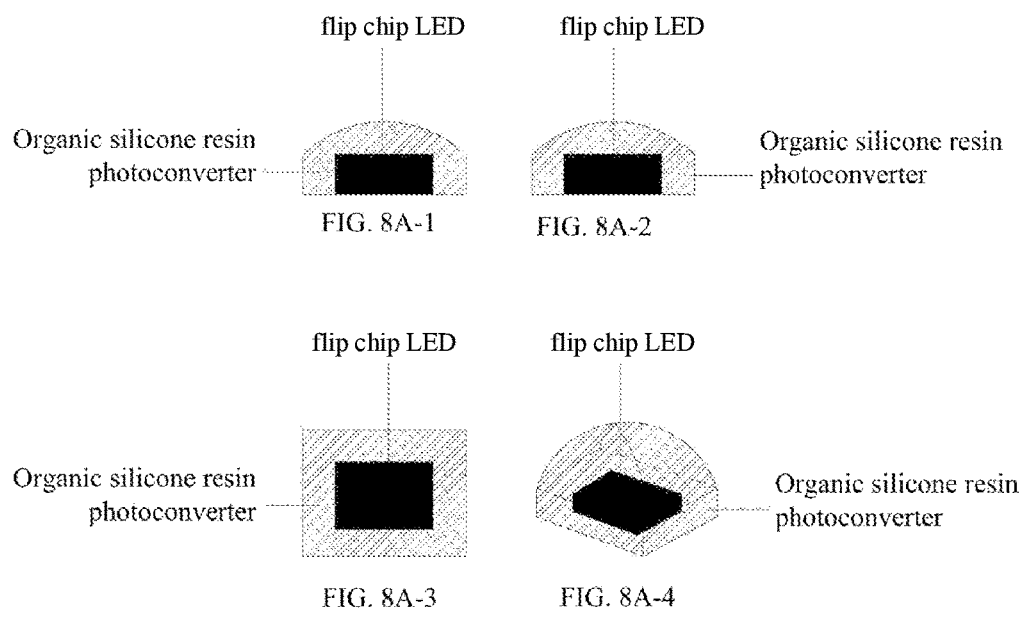
FIG. 8A shows a cambered surface-shaped LED package element manufactured according to the present invention, where
Figure 8B:
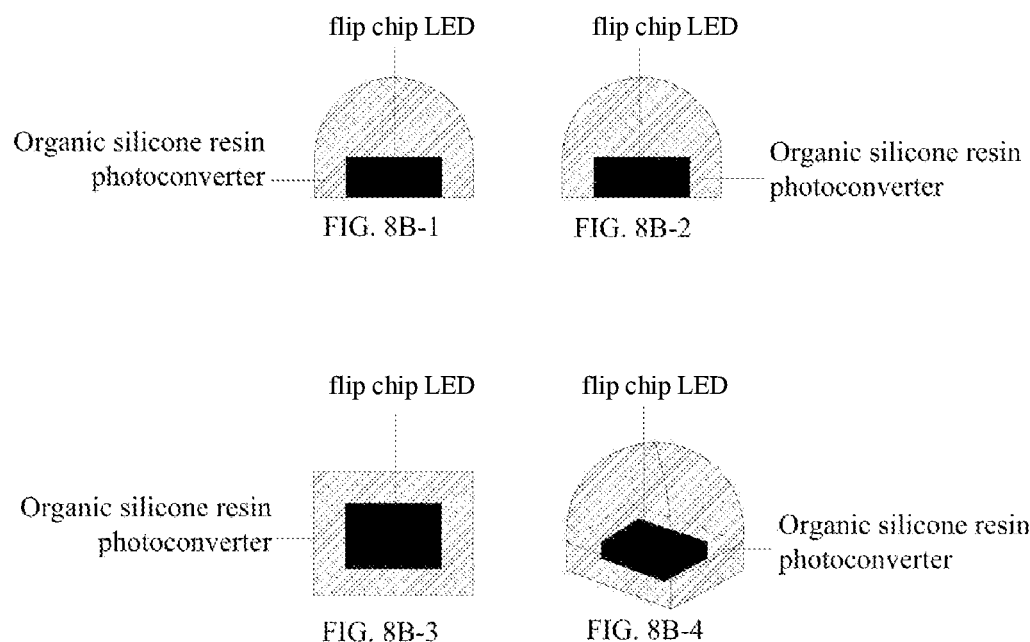
FIG. 8B shows a hemispheric surface-shaped LED package element manufactured according to the present invention, where
Figure 8C:
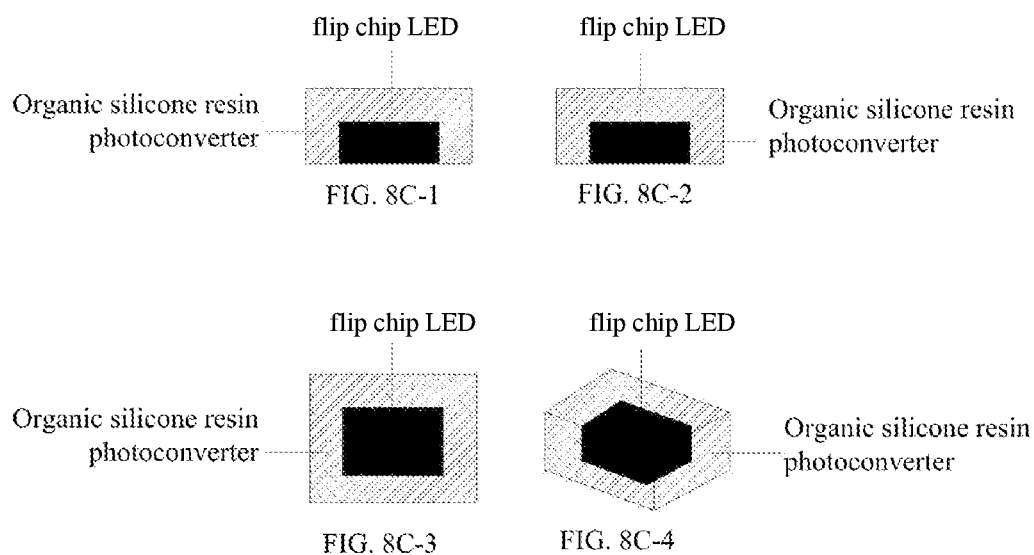
FIG. 8C shows a planar surface-shaped LED package element manufactured according to the present invention, where

Each finished individual LED package element manufactured according to the present invention may be a cambered surface-shaped LED package element, a hemispheric surface-shaped LED package element, or a planar surface-shaped LED package element, as shown in FIGS. 8A, 8B and 8C.

The equipment system for bond-packaging an LED using a special-shaped organic silicone resin photoconverter provided by the present invention is flow-type continuous process equipment. The process equipment is cooperatively linked, and is applicable to a continuous production process of bond-packaging an LED using a special-shaped organic silicone resin photoconverter, thus enhancing the production efficiency and yield of LED bond-packaging in batches by using the special-shaped organic silicone resin photoconverter.

In Embodiment 2 below, the equipment system of the present invention is applied to a new process of bond-packaging an LED using a special-shaped organic silicone resin photoconverter, and specific implementations of Embodiment 2 of the present invention are further described in detail.

Embodiment 2

A process for bond-packaging an LED using a special-shaped organic silicone resin photoconverter, to which the equipment system of the present invention is applied, includes the following continuous process flow: forming of a refined photoconversion sheet, roll-shaping of a photoconversion sheet array, sheet melting for the photoconversion sheet array, preparation of a flip chip LED array sheet, forming of LED package elements by roll-bonding, curing of the LED package elements, and cutting of the LED package elements. The process specifically includes the following steps:

step 1: roll-molding of a refined photoconversion sheet: in a vacuum heating condition, rolling an outer protective film A, a semi-cured photoconversion material, and an outer protective film B by using one or more sets of smooth-surface roll-laminating apparatuses, to obtain a refined photoconversion sheet formed by the outer protective film A, a semi-cured photoconversion sheet, and the outer protective film B, the semi-cured photoconversion material being a semi-cured photoconversion membrane or semi-cured photoconversion slurry, and a material of the outer protective film B being meltable organic silicon photosensitive resin containing a photoconversion material, as shown in FIG. 3A to FIG. 3C;

step 2: roll-shaping of a photoconversion sheet array: in a vacuum condition, performing heating and roll-shaping on the refined photoconversion sheet with the outer protective films by using a first rolling device with a protrusion array and a second rolling device with a recess array that are disposed face-to-face and aligned with each other, to obtain a photoconversion sheet array formed by individual photoconversion sheets with recesses, the recesses being located at a side close to the outer protective film B, as shown in FIG. 4A and FIG. 4B;

step 3: sheet melting for the photoconversion sheet array: in a vacuum illumination condition, melting the outer protective film B of the photoconversion sheet array in step 2, to obtain a sheet-melted photoconversion sheet array, as shown in FIG. 5;

step 4: preparation of a flip chip LED array sheet: acquiring a flip chip LED array sheet, where flip chip LEDs in the flip chip LED array sheet are arranged in an array on a carrier film, the flip chip LED referring to an individual flip chip LED or a flip chip LED assembly, and the flip chip LED assembly being composed of two or more individual flip chip LEDs;

step 5: forming of LED package elements by roll-bonding: in a vacuum heating condition, performing roll-bonding on the sheet-melted photoconversion sheet array in step 3 and the flip chip LED array sheet in step 4 by using a third rolling device with a smooth surface and a fourth rolling device with a recess array, the photoconversion sheet array and the flip chip LED array sheet facing each other and being aligned with each other, such that the flip chip LEDs in the flip chip LED array sheet are bonded to and embedded in the recesses on the individual photoconversion sheets of the sheet-melted photoconversion sheet array, to obtain LED package elements, a recess shape and recess dimensions of the recess array of the fourth rolling device being the same as those of the recess array of the second rolling device, as shown in FIG. 6;

step 6: curing of the LED package elements: by means of heat curing and/or photocuring, curing the LED package elements in step 5 by using a curing apparatus, to obtain cured LED package elements; and step 7: cutting of the LED package elements: removing the outer protective film A from the cured LED package elements in step 6, and cutting the cured LED package elements, to form finished LED package elements having slits for splitting the finished product into individual LED package elements.

Specific implementation solutions of the process for bond-packaging an LED using a special-shaped organic silicone resin photoconverter, to which the equipment system of the present invention is applied, are further disclosed as follows:

In step 1 of roll-molding of a refined photoconversion sheet, the rolling an outer protective film A, a semi-cured photoconversion material, and an outer protective film B by using one or more sets of smooth-surface roll-laminating apparatuses refers to: performing rolling sequentially by using one or more sets of smooth-surface double-roller roll-laminating apparatuses that are disposed face-to-face and aligned with each other and/or a rolling apparatus formed by a smooth-surface single-wheeled roller and a smooth-surface planar conveyor, to obtain a refined photoconversion sheet. Referring to FIGS. 3A, 3B and 3C, FIG. 3A shows step 1 of rolling an outer protective film A (8-3), a semi-cured photoconversion membrane (8-1), and an outer protective film B (8-4) by using one set of smooth-surface roll-laminating apparatuses, to obtain a refined photoconversion sheet (8-6); FIG. 3B shows step 1 of rolling an outer protective film A (8-3), semi-cured photoconversion slurry (8-2), and an outer protective film B (8-4) by using one set of smooth-surface roll-laminating apparatuses, to obtain a refined photoconversion sheet (8-6); FIG. 3C shows step 1 of rolling an outer protective film A (8-3), semi-cured photoconversion slurry (8-2), and an outer protective film B (8-4) by using two sets of smooth-surface roll-laminating apparatuses, to obtain a refined photoconversion sheet (8-6).

The temperature of the roll-molding of the refined photoconversion sheet in step 1 ranges from 50° C. to 120° C. The thickness of the refined photoconversion sheet is below 200 μm. A material of the semi-cured photoconversion sheet is a semi-cured organic silicone resin fluorescent powder membrane or a semi-cured organic silicone resin quantum dot fluorophor membrane. A material of the outer protective film A is polyester, polyolefin, or polyether. The photoconversion material in the outer protective film B and the photoconversion material in the semi-cured photoconversion sheet in step 1 are identical materials with identical contents. The material of the outer protective film B further includes an adhesive.

In step 2, the first rolling device with a protrusion array is a first single-wheeled roller with a protrusion array or a first planar conveyor with a protrusion array; the second rolling device with a recess array is a second single-wheeled roller with a recess array or a second planar conveyor with a recess array; and at least one of the first rolling device and the second rolling device is a single-wheeled roller. Referring to FIG. 4A and FIG. 4B, FIG. 4A shows step 2 of performing heating and roll-shaping on the refined photoconversion sheet (8-6) with the outer protective film A (8-3) and the outer protective film B (8-4) by using a first single-wheeled roller (2-1) with a protrusion array and a second single-wheeled roller (2-2) with a recess array that are disposed face-to-face and aligned with each other, to obtain a photoconversion sheet array formed by individual photoconversion sheets (8-7) with recesses; and FIG. 4B shows step 2 of performing heating and roll-shaping on the refined photoconversion sheet (8-6) with the outer protective film A (8-3) and the outer protective film B (8-4) by using a first single-wheeled roller 1 (2-1) with a protrusion array and a second planar conveyor (2-3) with a recess array that are disposed face-to-face and aligned with each other, to obtain a photoconversion sheet array formed by individual photoconversion sheets (8-7) with recesses.

The shape of each individual photoconversion sheet with recesses in step 2 is a cambered surface, a hemispheric surface, or a planar surface. For each individual photoconversion sheet with recesses, the length, width, and height of a recess are 1.01 to 1.05 times of those of a flip chip LED. An optimal length, width, and height of the recess are 1.02 times of those of the flip chip LED. The temperature of the roll-shaping of a photoconversion sheet array ranges from 50° C. to 120° C. An optimal temperature of the roll-shaping ranges from 80° C. to 100° C.

The sheet melting in step 3 refers to: melting the outer protective film B by means of light irradiation and integrating the sheet with the semi-cured photoconversion sheet in step 1. Referring to FIG. 5, FIG. 5 shows that in step 3, before sheet melting, the photoconversion sheet array formed by individual photoconversion sheets (8-7) with recesses passes through a sheet-melting apparatus 3, and the outer protective film B (8-4) of the photoconversion sheet array is radiated by light and then is integrated with the semi-cured photoconversion sheet, to obtain a sheet-melted photoconversion sheet array formed by individual photoconversion sheets (8-8) with recesses.

The carrier film in the flip chip LED array sheet in step 4 is a stretchable carrier film, and a material of the stretchable carrier film is one of heat-resistant polyester, polydimethylsiloxane, and polyvinyl chloride.

Step 5 of performing roll-bonding on the sheet-melted photoconversion sheet array in step 3 and the flip chip LED array sheet in step 4 by using a third rolling device with a smooth surface and a fourth rolling device with a recess array, the photoconversion sheet array and the flip chip LED array sheet facing each other and being aligned with each other refers to: arranging the photoconversion sheet array on a fourth single-wheeled roller with a recess array or a fourth planar conveyor with a recess array, arranging the flip chip LED array sheet on a third single-wheeled roller with a smooth roll surface or a third planar conveyor with a smooth flat surface, and then performing roll-bonding, such that the flip chip LEDs in the flip chip LED array are bonded to and embedded in the recesses on the individual photoconversion sheets of the sheet-melted photoconversion sheet array, to obtain the LED package elements.

The third rolling device with a smooth surface is the third single-wheeled roller with a smooth roll surface or the third planar conveyor with a smooth flat surface, the fourth rolling device with a recess array is the fourth single-wheeled roller with a recess array or the fourth planar conveyor with a recess array, and at least one of the device arranged with the photoconversion sheet array and the device arranged with the flip chip LED array sheet is a single-wheeled roller. Referring to FIG. 6, FIG. 6 shows step 5 of performing roll-bonding on the sheet-melted photoconversion sheet array formed by individual photoconversion sheets (8-8) and the flip chip LED array sheet by using the third single-wheeled roller (4-1) with a smooth surface and the fourth single-wheeled roller (4-2) with a recess array, the photoconversion sheet array and the flip chip LED array sheet facing each other and being aligned with each other, to obtain LED package elements (8-9).

The temperature of the forming of LED package elements by roll-bonding in step 5 ranges from 50° C. to 120° C. An optimal temperature of the roll-bonding in step 5 ranges from 80° C. to 100° C.

The photocuring in step 6 is curing with an active energy ray; and the curing temperature of the heat curing ranges from 140° C. to 180° C., and curing duration is less than or equal to 1 h. An optimal curing temperature ranges from 150° C. to 160° C., and optimal curing duration is 2 h.

Step 7 of cutting of the cured LED package elements refers to: performing roll-cutting on the cured LED package elements by using a rolling component C with an arrayed cutter and a rolling component D with a smooth surface in a face-to-face alignment manner, to obtain finished LED package elements having slits for splitting the finished product into individual LED package elements. The width of the slit is below 20 μm. The rolling component C with an arrayed cutter is a single-wheeled roller C with an arrayed cutter or a planar conveyor C with an arrayed cutter, the rolling component D with a smooth surface is a single-wheeled roller D with a smooth surface or a planar conveyor D with a smooth surface, and at least one of the rolling component C with an arrayed cutter and the rolling component D with a smooth surface is a single-wheeled roller, the arrayed cutter being a cutter having an array of rectangular grids.

As required, a stretcher may be used to stretch the stretchable carrier film of the finished LED package elements in step 7, such that the finished LED package elements are split along the slits after being stretched, to obtain finished individual LED package elements, as shown in FIG. 7A and FIG. 7B.

Any description that is not involved in the specific implementations of the present invention belongs to well-known technologies in the art and can be implemented with reference to the well-known technologies.

The present invention gains a satisfactory trial result after repeated test and verification.

The foregoing specific implementations and embodiments give a specific support for a technical idea of an equipment system for bond-packaging an LED using a special-shaped organic silicone resin photoconverter according to the present invention, and are not intended to limit the protection scope of the present invention. Any equivalent changes or modifications made on the basis of the technical solutions according to the technical idea proposed in the present invention still fall within the protection scope of the technical solutions of the present invention.

What is claimed is:

1. An equipment system for bond-packaging an LED using a special-shaped organic silicone resin photoconverter, comprising: a roll-laminating apparatus used for refining a photoconversion sheet; a roll-shaping apparatus used for performing heating and roll-shaping on the refined photoconversion sheet; a sheet-melting apparatus used for performing sheet melting on the roll-shaped refined photoconversion sheet; and a roll-bonding apparatus used for performing roll-bonding on the sheet-melted refined photoconversion sheet and a flip chip LED array with a carrier film, the refined photoconversion sheet and the flip chip LED array facing each other and being aligned with each other, and the roll-laminating apparatus, the roll-shaping apparatus, the sheet-melting apparatus, and the roll-bonding apparatus being arranged sequentially to form cooperatively linked process equipment, wherein
    the roll-laminating apparatus comprises one or more sets of smooth-surface rolling components A and smooth-surface rolling components B that perform rolling face-to-face in alignment with each other; the roll-shaping apparatus comprises a first rolling device with a protrusion array and a second rolling device with a recess array that perform rolling face-to-face in alignment with each other; and the roll-bonding apparatus comprises a third rolling device with a smooth surface and a fourth rolling device with a recess array that perform rolling face-to-face in alignment with each other.

2. The equipment system for bond-packaging an LED using a special-shaped organic silicone resin photoconverter according to claim 1, wherein the smooth-surface rolling component A of the roll-laminating apparatus is a smooth-surface single-wheeled roller A or a smooth-surface planar conveyor A, the smooth-surface rolling component B is a smooth-surface single-wheeled roller B or a smooth-surface planar conveyor B, and at least one of the smooth-surface rolling component A and the smooth-surface rolling component B is a single-wheeled roller.

3. The equipment system for bond-packaging an LED using a special-shaped organic silicone resin photoconverter according to claim 2, wherein in the roll-shaping apparatus, the first rolling device with a protrusion array is a first single-wheeled roller with a protrusion array or a first planar conveyor with a protrusion array; the second rolling device with a recess array is a second single-wheeled roller with a recess array or a second planar conveyor with a recess array; and at least one of the first rolling device with a protrusion array and the second rolling device with a recess array is a single-wheeled roller.

4. The equipment system for bond-packaging an LED using a special-shaped organic silicone resin photoconverter according to claim 3, wherein the sheet-melting apparatus is a light irradiation apparatus at least comprising an irradiation light source and a planar conveyor.

5. The equipment system for bond-packaging an LED using a special-shaped organic silicone resin photoconverter according to claim 4, wherein in the roll-bonding apparatus, the third rolling device with a smooth surface is a third single-wheeled roller with a smooth roll surface or a third planar conveyor with a smooth flat surface, the fourth rolling device with a recess array is a fourth single-wheeled roller with a recess array or a fourth planar conveyor with a recess array, and at least one of the device arranged with the photoconversion sheet array and the device arranged with a flip chip LED array sheet is a single-wheeled roller.

6. The equipment system for bond-packaging an LED using a special-shaped organic silicone resin photoconverter according to claim 5, wherein the roll-laminating apparatus is provided with a displacement adjusting device for adjusting a distance between the smooth-surface rolling component A and the smooth-surface rolling component B; the roll-shaping apparatus is provided with a displacement adjusting device for adjusting a distance between the first rolling device and the second rolling device; and the roll-bonding apparatus is provided with a displacement adjusting device for adjusting a distance between the third rolling device and the fourth rolling device.

7. The equipment system for bond-packaging an LED using a special-shaped organic silicone resin photoconverter according to claim 6, wherein any one of the smooth-surface rolling component A and the smooth-surface rolling component B in the roll-laminating apparatus that is a single-wheeled roller has a radial run-out distance less than or equal to 2 μm; any one of the first rolling device with a protrusion array and the second rolling device with a recess array in the roll-shaping apparatus that is a single-wheeled roller has a radial run-out distance less than or equal to 2 μm; any one of the third rolling device with a smooth surface and the fourth rolling device with a recess array in the roll-bonding apparatus that is a single-wheeled roller has a radial run-out distance less than or equal to 2 μm.

8. The equipment system for bond-packaging an LED using a special-shaped organic silicone resin photoconverter according to claim 7, wherein in the second rolling device with a recess array in the roll-shaping apparatus and the fourth rolling device with a recess array in the roll-bonding apparatus, the recess arrays have the same recess shape, and the recess shape is a cambered surface, a hemispheric surface, or a planar surface.

9. The equipment system for bond-packaging an LED using a special-shaped organic silicone resin photoconverter according to claim 8, wherein in the first rolling device with a protrusion array in the roll-shaping apparatus, the shape of a protrusion in the protrusion array is a planar surface, and the length, width, and height of the protrusion are 1.01 to 1.05 times of those of a flip chip LED.

10. The equipment system for bond-packaging an LED using a special-shaped organic silicone resin photoconverter according to claim 9, wherein the equipment system further comprises a curing apparatus for curing LED package elements, and the curing apparatus is process equipment located at a rear end of the roll-bonding apparatus.

11. The equipment system for bond-packaging an LED using a special-shaped organic silicone resin photoconverter according to claim 10, wherein the curing apparatus is a tunnel-type temperature control apparatus or a tunnel-type illuminating apparatus; the tunnel-type temperature control apparatus comprises a heating component, a temperature control component and a conveyor belt passage; and the tunnel-type illuminating apparatus comprises an illuminating component, an illumination intensity control component and a conveyor belt passage.

12. The equipment system for bond-packaging an LED using a special-shaped organic silicone resin photoconverter according to claim 10, wherein the equipment system further comprises a cutting apparatus for cutting cured LED package elements, and the cutting apparatus is process equipment located at a rear end of the curing apparatus.

13. The equipment system for bond-packaging an LED using a special-shaped organic silicone resin photoconverter according to claim 12, wherein the cutting apparatus is a roll-cutting apparatus, and the roll-cutting apparatus comprises a rolling component C with an arrayed cutter and a rolling component D with a smooth surface that are disposed face-to-face and aligned with each other.

14. The equipment system for bond-packaging an LED using a special-shaped organic silicone resin photoconverter according to claim 13, wherein the rolling component C with an arrayed cutter in the roll-cutting apparatus is a single-wheeled roller C with an arrayed cutter or a planar conveyor C with an arrayed cutter; the rolling component D with a smooth surface is a single-wheeled roller D with a smooth surface or a planar conveyor D with a smooth surface; and at least one of the rolling component C with an arrayed cutter and the rolling component D with a smooth surface is a single-wheeled roller, the arrayed cutter being a cutter having an array of rectangular grids.

15. The equipment system for bond-packaging an LED using a special-shaped organic silicone resin photoconverter according to claim 14, wherein the roll-cutting apparatus is provided with a displacement adjusting device for adjusting a distance between the rolling component C with an arrayed cutter and the rolling component D with a smooth surface; any one of the rolling component C with an arrayed cutter and the rolling component D with a smooth surface that is a single-wheeled roller has a radial run-out distance less than or equal to 2 μm.

16. The equipment system for bond-packaging an LED using a special-shaped organic silicone resin photoconverter according to claim 15, wherein the equipment system further comprises a flip chip LED array forming apparatus for forming a flip chip LED array; the flip chip LED array forming apparatus is process equipment located at a front end of the roll-bonding apparatus; and the flip chip LED array forming apparatus comprises a manipulator for grabbing and placing a flip chip LED, and a planar conveying component having an accurate displacement positioning function.

17. The equipment system for bond-packaging an LED using a special-shaped organic silicone resin photoconverter according to claim 16, wherein the roll-laminating apparatus, the roll-shaping apparatus, the sheet-melting apparatus, the chip array forming apparatus, the roll-bonding apparatus, the curing apparatus, and the cutting apparatus in the equipment system are cooperatively linked in sequence, to form flow-type continuous process equipment.

* * * * *